United States Patent
Park

(10) Patent No.: US 7,852,328 B2
(45) Date of Patent: Dec. 14, 2010

(54) DATA INPUT METHOD AND APPARATUS, AND LIQUID CRYSTAL DISPLAY DEVICE USING THE SAME

(75) Inventor: Jong Hyon Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 993 days.

(21) Appl. No.: 11/627,431

(22) Filed: Jan. 26, 2007

(65) Prior Publication Data

US 2007/0180347 A1    Aug. 2, 2007

(30) Foreign Application Priority Data

Jan. 27, 2006   (KR) .................... 10-2006-0008925

(51) Int. Cl.
*G09G 3/36*    (2006.01)

(52) U.S. Cl. ................... 345/204; 345/98; 345/99

(58) Field of Classification Search ............ 345/98–100, 345/204, 211–213, 690
See application file for complete search history.

(56) References Cited

U.S. PATENT DOCUMENTS

| | | | |
|---|---|---|---|
| 6,664,943 B1 * | 12/2003 | Nakajima et al. | 345/98 |
| 6,788,280 B2 * | 9/2004 | Ham | 345/89 |
| 6,867,759 B1 * | 3/2005 | Baek et al. | 345/99 |
| 7,586,485 B2 * | 9/2009 | Teshirogi et al. | 345/204 |

* cited by examiner

*Primary Examiner*—Henry N Tran
(74) *Attorney, Agent, or Firm*—Cantor Colburn LLP

(57) ABSTRACT

For a data input method and apparatus capable of latching data from a memory by using a clock of optimal timing, and a liquid crystal display device using the same, a clock of an optimal margin is set by reading out check data stored in a memory, and the check data read out from the memory is latched and generated according to the set clock of the optimal margin.

17 Claims, 5 Drawing Sheets

DATA INPUT METHOD AND APPARATUS, AND LIQUID CRYSTAL DISPLAY DEVICE USING THE SAME

This application claims priority to Korean Patent Application No. 2006-0008925, filed on Jan. 27, 2006 and all the benefits accruing therefrom under 35 U.S.C. §119, and the contents of which in its entirety are herein incorporated by reference.

BACKGROUND OF THE INVENTION

1. Field of the Invention

The present invention relates to a data input method and apparatus, and a liquid crystal display device using the same, and more particularly, to a data input method and apparatus capable of preventing a data input error caused by temperature and circuit deviation, and a liquid crystal display device using the same.

2. Description of the Related Art

Flat panel display devices include a liquid crystal display ("LCD") device using liquid crystals, a plasma display panel ("PDP") using a discharge of an inert gas, an organic light emitting device ("OLED"), etc. The PDP is used for large-sized TVs, whereas the OLED is applied to small-sized products. Meanwhile, the LCD is widely applied to many fields ranging from small-sized display devices to large-sized display devices such as cellular phones, notebook computers, monitors and TVs.

The flat panel display device includes a display panel for displaying an image through a pixel matrix, a panel driving circuit for driving the display panel, and a timing controller for controlling the panel driving circuit. The timing controller includes a data converter for improving picture quality by compensating for data and necessarily includes a memory for storing data input from the exterior and supplying the stored data to the data converter.

The timing controller uses a clock when storing data in the memory or reading out the stored data. The timing controller latches the data read out from the memory according to the clock and supplies the latched data to the data converter. Since a setup margin and a hold margin of the data are needed to latch the data accurately, it is preferable that an edge of the clock is aligned with the center of the data. However, even if a phase value of the clock is set so that the center of the data is aligned with the edge of the clock, a timing skew between the data and the clock deviates due to ambient temperature, clock delay and circuit deviation, thereby inducing an error during data latch. The error is represented as noise on a screen.

SUMMARY OF THE INVENTION

The present invention provides a data input method and apparatus capable of latching data from a memory by using a clock of optimal timing, and an LCD device using the same.

In accordance with exemplary embodiments of the present invention, there is provided a data input method including setting a clock of an optimal margin by reading out check data stored in a memory, latching the check data read out from the memory according to the set clock of the optimal margin, and generating latched check data.

Setting a clock of an optimal margin may include storing original check data in the memory, reading out the original check data stored in the memory, inputting a transmission clock transmitted together with the original check data from the memory, converting the transmission clock into a plurality of clocks having different phases; latching the original check data according to the plurality of clocks to generate the latched check data, and detecting identical check data by comparing a plurality of the latched check data with the original check data and setting a clock used for latching detected identical check data as the clock of the optimal margin.

Detecting identical check data and setting a clock used for latching detected identical check data as the clock of the optical margin may include detecting a plurality of latched check data identical to the original check data among the plurality of the latched check data, detecting a plurality of clocks used to latch the plurality of the detected identical check data, and setting a clock having any one phase value among the plurality of the detected clocks as the clock of the optimal margin. Here, a clock having a middle phase value among the plurality of the detected clocks is set as the clock of the optimal margin. In other words, a clock having a rising edge aligned with a center of the original check data is set as the clock of the optimal margin.

The original check data may be stored in the memory during a blank period between valid data periods of each frame or of each horizontal period.

The data input method may further include storing a plurality of original check data in the memory, repeating operations of reading out the original check data and setting the clock of the optimal margin with respect to the plurality of original check data stored in the memory, and finally setting a clock having a highest setting frequency in the repeating operations portion of the data input method as the clock of the optimal margin.

The data input method may further include inputting valid data from the memory, inputting a transmission clock transmitted together with the valid data from the memory, converting the transmission clock into a plurality of clocks having different phases, latching the valid data according to the plurality of clocks, and selectively generating valid data latched according to the clock of the optimal margin among the plurality of latched valid data.

The data input method may further include supplying the valid data latched according to the clock of the optimal margin to a data converter, and supplying converted data to a data driver of a display device.

In accordance with other exemplary embodiments of the present invention, there is provided a data input apparatus including a memory storing data, and a data input part setting a clock of an optimal margin using prescribed data read out from the memory, latching data read out from the memory according to the clock of the optimal margin, and generating latched data.

The data input part may include a clock converter inputting a transmission clock transmitted together with the data from the memory and converting the transmission clock into a plurality of clocks having different phases, a data latch latching the data from the memory according to the plurality of clocks from the clock converter, and an optimal data selector setting the clock of the optimal margin by comparing a plurality of latched data generated from the data latch with original data from the memory and selectively generating data latched according to the clock of the optimal margin.

The memory stores original check data, the data latch latches the original check data from the memory according to the plurality of clocks, and the optimal data selector detects identical check data by comparing a plurality of latched check data generated from the data latch with original check data from the memory and sets a clock used in the data latch to latch detected identical check data as the clock of the optimal margin.

The optimal data selector detects a plurality of latched check data identical to the original check data among the plurality of the latched check data, detects a plurality of clocks used for latching the plurality of the detected identical check data, and sets a clock having any one phase value among the plurality of detected clocks as the clock of the optimal margin. The optimal data selector sets a clock having a middle phase value among the plurality of the detected clocks as the clock of the optimal margin.

The memory may store a plurality of original check data in the memory during the blank period, and the data input part may repeat an operation of setting the clock of the optimal margin with respect to the plurality of the original check data stored in the memory and may finally set a clock having a highest setting frequency as the clock of the optimal margin.

The memory may further store valid data, the data latch may latch the valid data from the memory according to the plurality of clocks, and the optimal data selector may selectively generate valid data latched according to the clock of the optimal margin among the plurality of valid data input from the data latch.

In accordance with further exemplary embodiments of the present invention, there is provided an LCD device including an LCD panel displaying an image through a pixel matrix using liquid crystals, a gate driver driving a gate line of the pixel matrix, a data driver driving a data line of the pixel matrix, and a timing controller processing data input through the data input part, supplying the processed data to the data driver, and controlling the gate driver and the data driver, where the data input part sets a clock of an optimal margin using check data read out from a memory of the timing controller, latches data read out from the memory according to the clock of the optimal margin, and generates latched data.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE INVENTION

Figure 1:
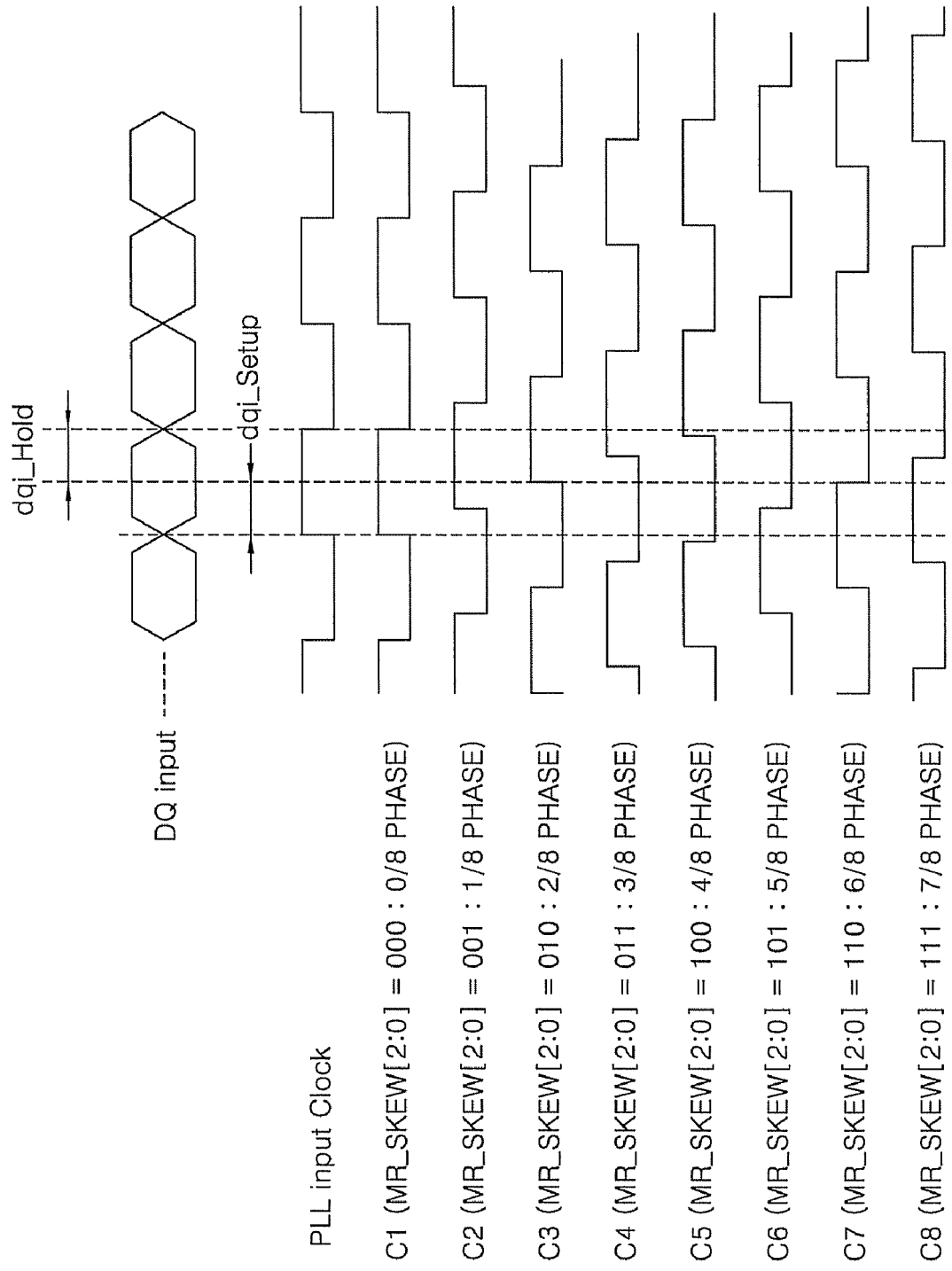
FIG. 1 is a waveform chart for describing an exemplary method of setting a clock of an optimal margin in an exemplary data input part of an exemplary timing controller according to an exemplary embodiment of the present invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The exemplary embodiments of the present invention will now be described with reference to the attached drawings.

Figure 2:
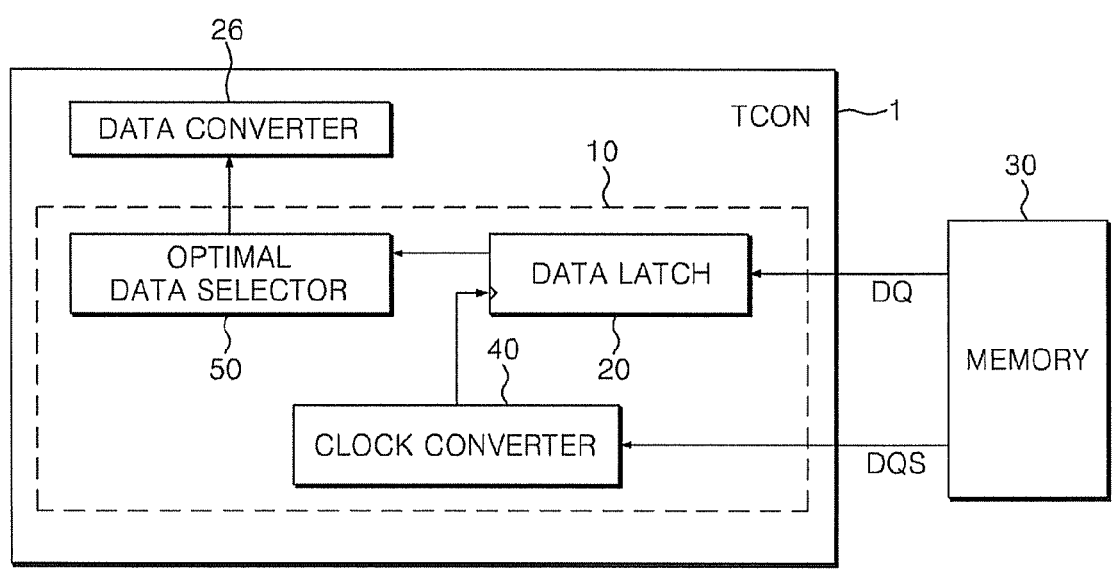
FIG. 2 is a block diagram of the exemplary data input part of the exemplary timing controller according to an exemplary embodiment of the present invention.

FIG. 1 is a waveform chart for describing an exemplary method of setting a clock of an optimal margin in an exemplary data input part of an exemplary timing controller according to an exemplary embodiment of the present invention. FIG. 2 is a block diagram of the exemplary data input part of the exemplary timing controller according to an exemplary embodiment of the present invention.

The timing controller 1 according to exemplary embodiments of the present invention stores valid data, input from an exterior source, in a memory on a frame basis. In this case, the timing controller 1 stores valid data of each frame input from the exterior, such as an exterior source, and stores check data DQ used for selecting a clock of optimal timing in the data input part 10 in the middle of the valid data. For example, the timing controller 1 stores a plurality of check data DQ in a remaining space of the memory during a blank period after valid data of each frame or horizontal period is supplied and before valid data of the next frame or horizontal period is supplied. Then the data input part 10 sets a clock of an optimal margin in real time by using the check data DQ in the middle of latching and inputting the valid data, thereby preventing a data error caused by temperature, circuit deviation, etc.

Referring to FIG. 1, and with further reference to FIG. 2, when the data input part 10 of the timing controller 1 reads out the check data DQ from the memory 30, a clock DQS is input together with the check data DQ. The data input part 10 generates a plurality of clocks having different phases, i.e., first to eighth clocks C1 to C8 with different phase values 0/8 to 7/8, according to a phase setting value MR_SKEW[2:0] by using the clock DQS input from the memory 30. The data input part 10 latches the check data DQ input from the memory 30 according to the first to eighth clocks C1 to C8 and generates the latched check data. Thereafter, the data input part 10 detects a clock of an optimal margin by comparing a plurality of the generated check data with original check data and sets the clock as an optimal clock. For instance, check data latched according to the second to fourth clocks C2, C3 and C4 of which phase setting values MR_SKEW[2:0] are 001, 010 and 011, respectively, among the 8 clocks C1 to C8 shown in FIG. 1 is detected as data identical to the original check data. Here, even though check data latched according to the second to fourth clocks C2, C3 and C4 is detected as data identical to the original check data, since the third clock C3 having a middle phase value 010 approximates to the center of the check data DQ, as indicated by a leading edge of the waveform associated with clock C3 aligned with the central vertical dotted line, and a setup margin dqi_Setup and a hold margin dqi_Hold are optimal, the third clock C3 is set as a clock of an optimal margin rather than the second or fourth clocks C2, C4. Then, the data input part 10 latches the next valid data according to the clock set as the optimal margin through the above processes and supplies the latched data to a data converter 26. Namely, the data input part 10 latches valid data input from the memory 30 according to a plurality of clocks with different phases, selects the latched data in response to the clock set as the optimal margin through the above processes, and supplies the selected data to the data converter 26. Accordingly, the data input part 10 selectively generates data latched by the clock of the optimal margin in real time, thereby preventing a data error.

Referring further to FIG. 2, a data input part 10 of a timing controller 1 includes a clock converter 40 for converting a clock DQS received from a memory 30 into a plurality of clocks having different phases, by example only, clocks C1 to C8 as shown in FIG. 1, a data latch 20 for latching data DQ received from the memory 30 in response to the plurality of clocks from the clock converter 40, and an optimal data selector 50 for selecting data latched by optimal clock timing among the data generated from the data latch 20 and supplying the selected data to a data converter 26.

The timing controller 1 stores data input from the exterior in the memory 30 on a frame basis. At this time, the timing controller 1 stores valid data input from the exterior during each frame or horizontal period and stores check data DQ used for selecting a clock of optimal timing in the middle of the valid data. For example, the timing controller 1 stores a plurality of check data DQ in a remaining space of the memory 30 during a blank period after the valid data of each frame or horizontal period is supplied and before the valid data of the next frame or horizontal period is supplied. Then the data input part 10 reads out the check data DQ from the memory 30, latches the check data DQ by the plurality of clocks having different phases, detects a clock of an optimal margin by comparing the latched data with original data, and sets the clock of an optimal margin as an optimal clock.

Figure 3:
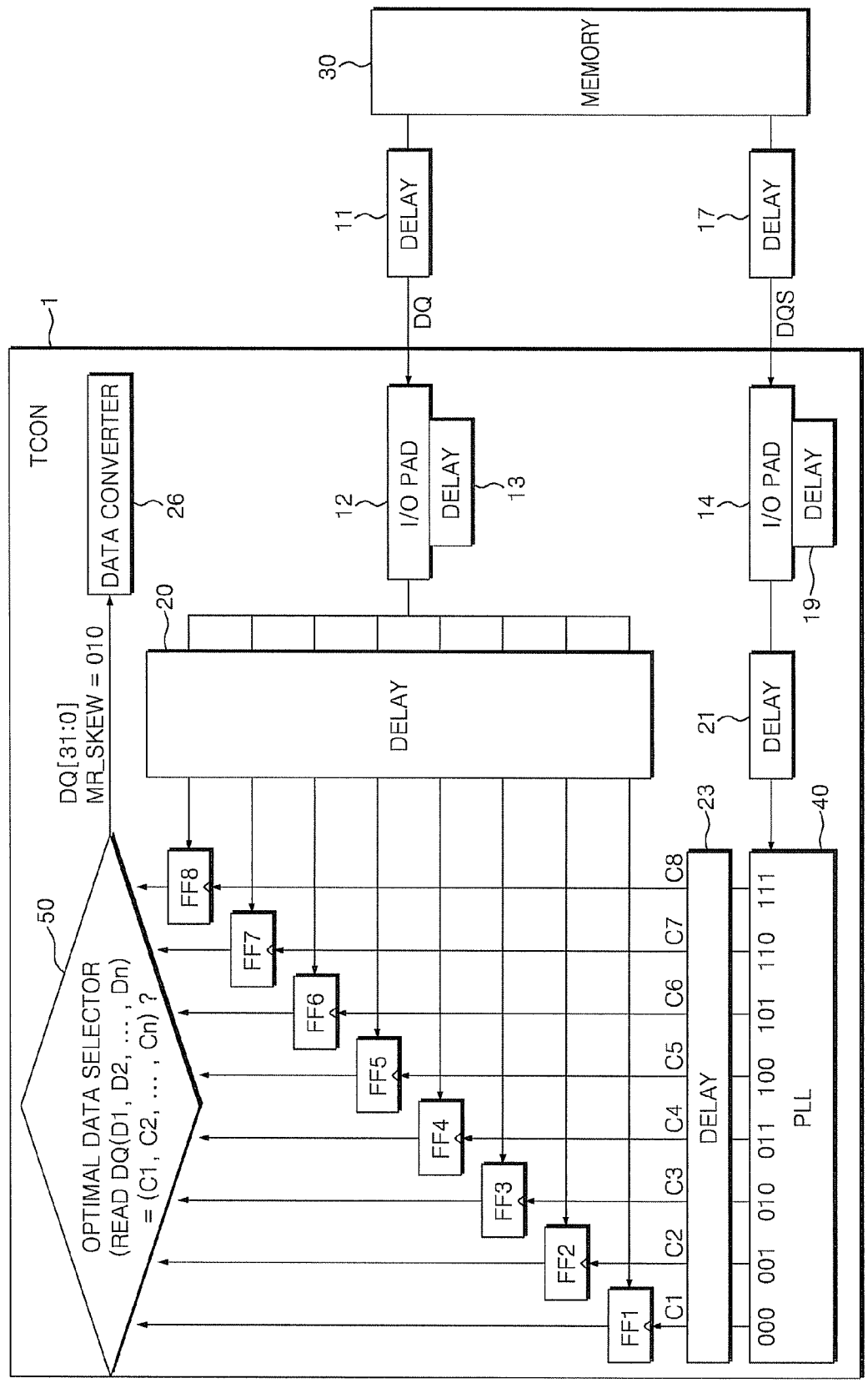
FIG. 3 is an expanded block diagram of the exemplary data input part shown in FIG. 2.
Figure 4:
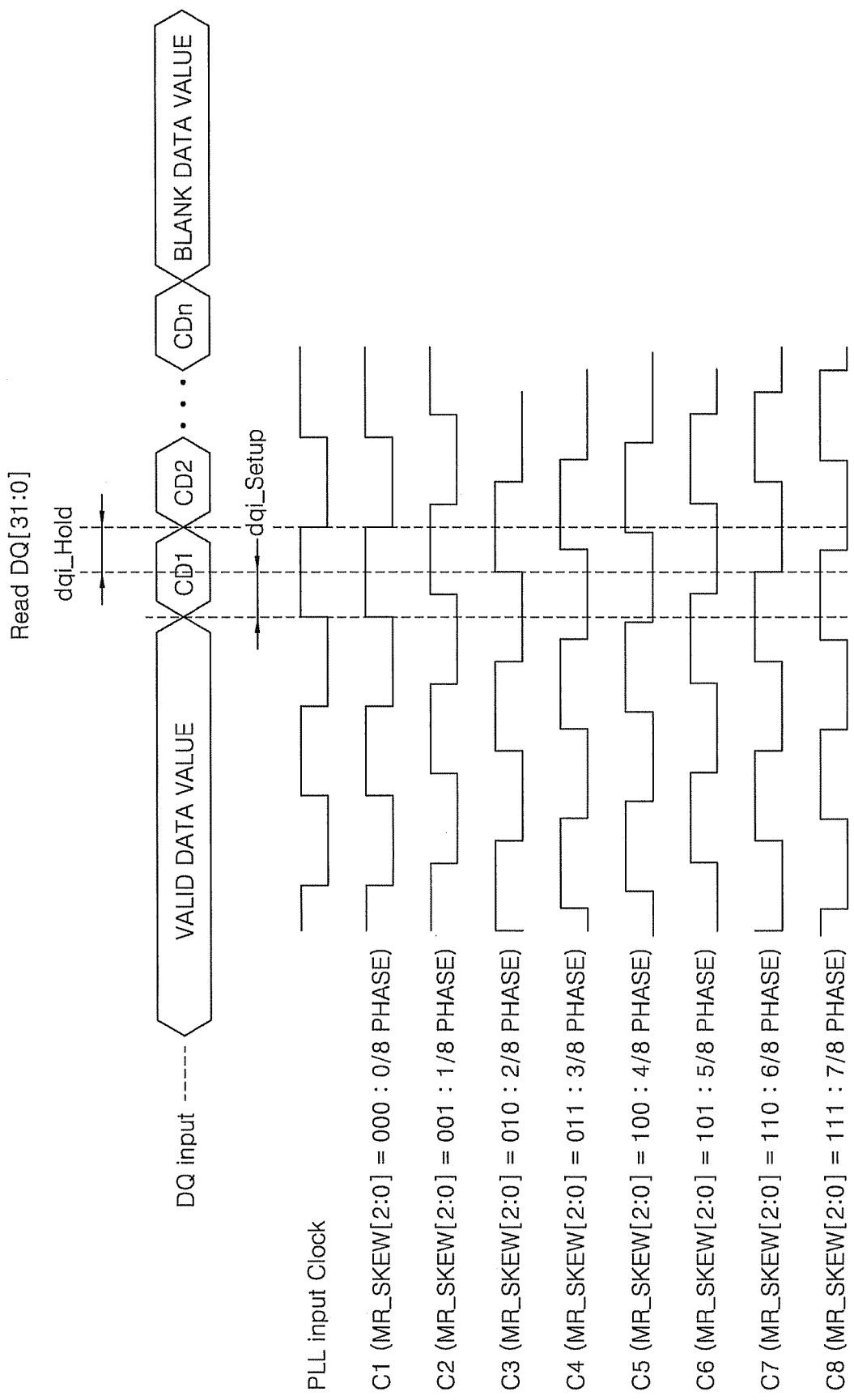
FIG. 4 is a waveform chart for describing an exemplary method of selecting a clock of an optimal margin of an exemplary optical data selector shown in FIG. 3.

FIG. 3 is a detailed block diagram of the exemplary data input part shown in FIG. 2. FIG. 4 is a waveform chart comparing a timing skew between a plurality of clocks from an exemplary clock converter and check data from an exemplary memory shown in FIG. 3.

The timing controller 1 stores valid data input from the exterior in the memory 30 on a frame basis and stores check data DQ in a remaining space of the memory 30 during a blank period of each frame or horizontal period. As the memory 30, a Double Data Rate Synchronous Dynamic Random Access Memory ("DDR SDRAM") may be used. If the timing controller 1 reads out data stored in the memory 30, the data DQ from the memory 30 is supplied to the data latch 20 and the clock DQS input in synchronization with the data DQ from the memory 30 is supplied to the clock converter 40. The data DQ input from the memory 30 is input through an input/output pad 12 of the timing controller 1 as illustrated in FIG. 3 and its phase is delayed through a plurality of delays, including delay 11 from the memory 30, delay 13 in association with input/output pad 12, and delay prior to data latch 20. The delayed data is then supplied to the data latch 20. The clock DQS input from the memory 30 is input through an input/output pad 14 of the timing controller 1 as shown in FIG. 3 and its phase is delayed through a plurality of delays, including delay 17 from the memory 30, delay 19 in association with input/output pad 14, and delay 21 prior to clock converter 40. The delayed clock is then supplied to the clock converter 40.

The clock converter 40 converts the clock DQS from the memory 30 into, for example, the plurality of clocks C1 to C8 having different phases according to the phase setting value MR_SKEW. The clock converter 40 includes, for example, a phase locked loop ("PLL"), a phase-locked oscillating circuit, as shown in FIG. 3. The PLL 40 converts the clock DQS input from the memory 30 into the first to eighth clocks C1 to C8 having different phase values of 0/8 phase to 7/8 phase according to a 3-bit phase setting value MR_SKEW[2:0] as shown in FIG. 4 and supplies the clocks C1 to C8 to the data latch 20. The phases of the first to eighth clocks C1 to C8 from the clock converter 40 may be identically delayed through a delay 23 and the phase delayed clocks may be supplied to the data latch 20.

The data latch 20 latches the data DQ input from the memory 30 in response to the plurality of clocks C1 to C8 input from the clock converter 40 and supplies the latched data to the optimal data selector 50. In the case where the clock converter 40 converts the clock DQS into the first to eighth clocks C1 to C8, the data latch 20 includes first to eighth latches FF1 to FF8 for inputting the 8 clocks C1 to C8 having different phases and each of the first to eighth latches FF1 to FF8 includes an N-bit latch corresponding to the number N of bits of the data DQ, that is, of N flip-flops or bistable multivibrators, which are pulsed digital circuits capable of serving as one bit memories. Each of the first to eighth latches FF1 to FF8 latches the data DQ input from the memory 30 in response to a specific edge of each of the first to eighth clocks C1 to C8, for example, a rising edge, and supplies the latched data to the optimal data selector 50. Therefore, first to eighth N-bit data latched by the first to eighth latches FF1 to FF8 in response to the first to eighth clocks C1 to C8 are simultaneously output to the optimal data selector 50.

The optimal data selector 50 sets a clock of an optimal margin by using the check data DQ stored in the memory 30, selects the data latched according to the clock of the optimal margin set in the above processes among the first to eighth N-bit data generated from the data latch 20, and supplies the latched data to the data converter 26. In other words, the optimal data selector 50 sets the clock of the optimal margin by using the check data DQ stored in the memory 30 during a blank period of each frame. The optimal data selector 50 then selects valid data latched according to the clock of the optimal margin set during a previous blank period among a plurality of valid data latched according to the plurality of clocks C1 to C8 via the data latch 20 and supplies the selected valid data to the data converter 26.

As shown in FIG. 4, a first check data CD1 of 32 bits (e.g., N=32) stored in the memory 30 during a blank period of each frame or horizontal period is latched through the data latch 20 in response to the first to eighth clocks C1 to C8 and supplied to the optimal data selector 50. The optimal data selector 50 compares a plurality of check data CD1 input from the data latch 20 with original check data, detects data identical to the original check data, and selects a clock of an optimal margin among clocks used for latching the detected data. Referring to FIG. 4, check data latched as a response of the second to fourth clocks C2, C3 and C4 of which phase setting values MR_SKEW[2:0] are 001, 010 and 011, respectively, among the 8 clocks C1 to C8 is detected as data identical to the original check data. However, even though check data latched according to the second clock C2 is detected as data identical to the original check data, the second clock C2 of which phase setting value MR_SKEW[2:0] is 001 is in short of a setup margin dqi_Setup and, even though check data latched according to the fourth clock C4 is detected as data identical to the original check data, the fourth clock C4 of which phase setting value MR_SKEW[2:0] is 011 is in short of a hold margin dqi_Hold. Meanwhile, since the third clock C3 of which phase setting value MR_SKEW[2:0] is 010 approximates to the center of the check data CD1, as indicated by the leading edge of the waveform of the third clock C3 aligned with the center of the data, as indicated by the central dotted line, and thus the setup margin dqi_Setup and the hold margin dqi_Hold are proper, the third clock C3 is selected as an optimal clock. Therefore, the optimal data selector 50 selects the third latch FF3 for inputting the third clock C3 as an optimal latch. The optimal data selector 50 repeats an operation of selecting a clock of an optimal margin in the same way as the above-described process with respect to the other check data CD2 to CDn stored during the blank period and finally selects a clock with the highest selecting frequency, the third clock C3 for example, as the clock of the optimal margin.

Thereafter, the optimal data selector 50 selects valid data latched according to the clock set as the optimal margin during the blank period among a plurality of valid data input via the data latch 20 from the memory 30 and supplies the selected valid data to the data converter 26.

As described above, the data input part 10 of the timing controller 1 sets a clock of an optimal margin by using the check data DQ stored in the memory 30 in the middle of valid data, that is, during a blank period. If the valid data is input from the memory 30, the data input part 10 selects valid data latched according to the clock of the optimal margin and supplies the selected data to the data converter 26. Since the timing controller 1 sets the clock of the optimal margin in real time, a data input error caused by temperature, circuit deviation, etc. can be prevented.

Figure 5:
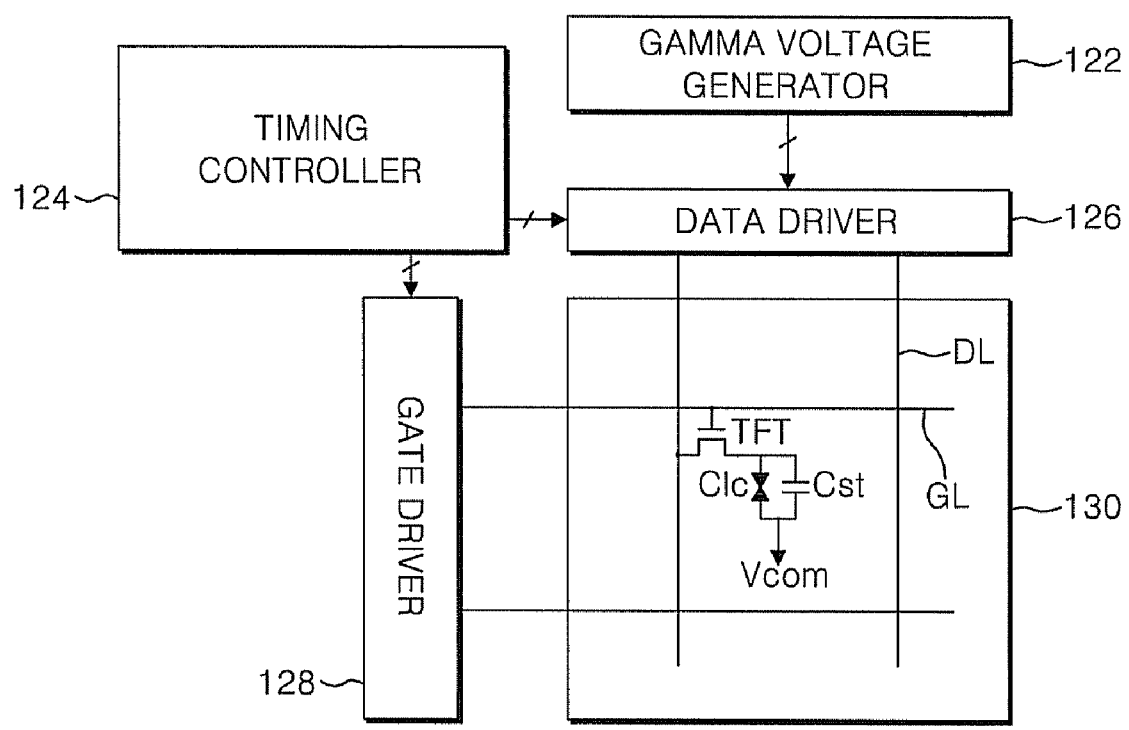
FIG. 5 is block diagram of an exemplary LCD device to which the exemplary timing controller according to an exemplary embodiment of the present invention is applied.

FIG. 5 is block diagram of an exemplary LCD device to which the exemplary timing controller according to an exemplary embodiment of the present invention is applied.

Referring to FIG. 5, the LCD device includes a gate driver 128 for driving gate lines GL of an LCD panel 130, a data driver 126 for driving data lines DL of the LCD panel 130, a gamma voltage generator 122 for generating a gamma voltage and supplying the gamma voltage to the data driver 126, and a timing controller 124 for controlling the data and gate drivers 126 and 128, converting input data and supplying the converted data to the data driver 126.

The timing controller 124 compensates for data input from the exterior, such as an external computer system (not shown), to improve picture quality and supplies the compensated data to the data driver 126. For example, the timing controller 124 includes a dynamic capacitance compensation ("DCC") circuit to improve a response speed, converts the input data into DCC data through the DCC circuit, and supplies the converted data to the data driver 126. Here, the timing controller 124 stores the input data in the memory 30 as shown in FIG. 2, reads out the data stored in the memory 30 through the data input part 10, latches the data, and supplies the latched data to the DCC circuit. Since the data input part 10 sets a clock of an optimal margin in real time by using the check data stored in the memory 30, selects the data latched according to the clock of the optimal margin and supplies the selected data to the DCC circuit, a data input error caused by temperature, circuit deviation, etc. is prevented. The timing controller 124 also generates a plurality of control signals for controlling the driving timing of the gate and data drivers 128 and 126 by using a plurality of control signals input from the external computer system together with data, for example, by using a dot clock, a data enable signal, a vertical synchronization signal, a horizontal synchronization signal, etc. It should be understood that the exemplary embodiments and features of the timing controller 1 described with respect to FIGS. 2 to 4 may be incorporated within the timing controller 124 of the LCD device.

The gamma voltage generator 122 generates a plurality of gamma voltages depending on a plurality of gray scales and supplies the gamma voltages to the data driver 126.

The data driver 126 converts digital data received from the timing controller 124 into an analog data signal and supplies the analog data signal to the plurality of data lines DL of the LCD panel 130. The data driver 126 selects a gamma voltage of a gray scale corresponding to the digital data received from the timing controller 124 among the plurality of gamma voltages generated from the gamma voltage generator 122 and supplies the selected gamma voltage to each data line DL of the LCD panel 130. At this time, the data driver 126 selects a gamma voltage of positive polarity or negative polarity (common voltage reference) according to a polarity control signal received from the timing controller 124 and supplies the selected gamma voltage to each data line DL.

The gate driver 128 generates a gate signal according to a control signal from the timing controller 124 and sequentially drives the plurality of gate lines GL. The gate driver 128 sequentially supplies a gate ON voltage to the plurality of gate lines GL according to the control signal from the timing controller 124 and supplies a gate OFF voltage until the gate ON voltage is supplied in the next field.

The LCD panel 130 displays an image by a combination of pixels arrayed in a matrix form, where the matrix is defined by an intersection of the gate lines GL with the data lines DL. Each of the pixels may represent a desired color by a combination of red, green, and blue subpixels. Each subpixel is represented by a liquid crystal capacitor Clc including a pixel electrode and a common electrode supplying a voltage to a liquid crystal layer. Each liquid crystal capacitor Clc is independently driven by a thin film transistor ("TFT") connected to the gate and data lines GL and DL. The TFT is turned on by the gate ON voltage of the gate line GL to charge a data signal of the data line DL to the liquid crystal capacitor Clc. The TFT is turned off by the gate OFF voltage of the gate line GL to maintain the data signal charged to the liquid crystal capacitor Clc. The liquid crystal capacitor Clc drives liquid crystals within the liquid crystal layer by charging the data signal supplied through the TFT on the basis of a common voltage Vcom supplied to the common electrode, thereby changing an alignment of liquid crystal molecules in the liquid crystal layer and adjusting transmittance of light. Each subpixel may also include a storage capacitor Cst connected in parallel to the liquid crystal capacitor Clc to compensate for a leakage current while the TFT is turned off.

As is apparent from the foregoing description, the data input method and apparatus according to exemplary embodiments of the present invention set a clock of an optimal margin by using the check data stored in the memory, select data latched according to the clock of the optimal margin, and supply the selected data to the next circuit block. Therefore, a data input error caused by temperature and circuit deviation can be prevented. Since the LCD device, to which the timing controller including the data input apparatus according to exemplary embodiments of the present invention is applied, latches data by the clock of the optimal margin, a noise caused by a data input error is prevented.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A data input method comprising:
   storing original check data in a memory;
   reading out the original check data stored in the memory;
   reading a transmission clock transmitted together with the original check data from the memory;
   converting the transmission clock into a plurality of clocks having different phases from each other and a same frequency as the transmission clock;
   latching the original check data according to the plurality of clocks to generate a plurality of latched check data;
   detecting latched check data, which is identical to the original check data, by comparing the plurality of the latched check data with the original check data; and
   setting a clock used for latching detected identical check data as a clock of an optimal margin.

2. The data input method as claimed in claim 1, wherein detecting the latched check data, which is identical to the original check data, comprises:
   detecting a plurality of latched check data identical to the original check data among the plurality of the latched check data; and
   detecting a plurality of clocks used to latch the plurality of the detected identical check data,
   and wherein setting the clock used for latching detected identical check data as the clock of the optimal margin comprises setting a clock having any one phase value among the plurality of detected clocks as the clock of the optimal margin.

3. The data input method as claimed in claim 2, wherein a clock having a rising edge aligned with a center of the original check data is set as the clock of the optimal margin.

4. The data input method as claimed in claim 3, wherein the original check data is stored in the memory during a blank period between valid data periods of each frame or of each horizontal period.

5. The data input method as claimed in claim 4, further comprising:
   storing a plurality of original check data in the memory;
   repeating operations of reading out the original check data and setting the clock of the optimal margin with respect to the plurality of original check data stored in the memory; and
   finally setting a clock having a highest setting frequency in the repeating operations portion of the data input method as the clock of the optimal margin.

6. The data input method as claimed in claim 4, further comprising:
   reading valid data from the memory;
   latching the valid data according to the plurality of clocks, the transmission clock being transmitted together with the valid data; and
   selectively generating valid data latched according to the clock of the optimal margin among the plurality of latched valid data.

7. The data input method as claimed in claim 6, further comprising supplying the valid data latched according to the clock of the optimal margin to a data converter.

8. The data input method as claimed in claim 1, further comprising latching valid data according to a plurality of clocks, and selectively generating valid data latched according to the clock of the optimal margin.

9. The data input method as claimed in claim 8, further comprising supplying the valid data latched according to the clock of the optimal margin to a data converter, and supplying converted data to a data driver of a display device.

10. A data input apparatus comprising:
    a memory storing data:
    a clock converter inputting a transmission clock transmitted together with the data from the memory and converting the transmission clock into a plurality of clocks having different phases from each other and a same frequency as the transmission clock;
    a data latch latching the data from the memory according to the plurality of clocks from the clock converter; and
    an optimal data selector setting a clock of an optimal margin by comparing the plurality of the latched data generated from the data latch with original data from the memory.

11. The data input apparatus as claimed in claim 10, wherein the memory stores original check data, the data latch latches the original check data from the memory according to the plurality of clocks, and the optimal data selector detects identical check data by comparing a plurality of latched check data generated from the data latch with original check data from the memory and sets a clock used in the data latch to latch detected identical check data as the clock of the optimal margin.

12. The data input apparatus as claimed in claim 11, wherein the optimal data selector detects a plurality of latched check data identical to the original check data among the plurality of the latched check data, detects a plurality of clocks used for latching the plurality of the detected identical check data, and sets a clock having any one phase value among the plurality of detected clocks as the clock of the optimal margin.

13. The data input apparatus as claimed in claim 12, wherein a clock having a middle phase value among the plurality of the detected clocks is set as the clock of the optimal margin.

14. The data input apparatus as claimed in claim 13, wherein the original check data is stored in the memory during a blank period between valid data periods of each frame or of each horizontal period.

15. The data input apparatus as claimed in claim 14, wherein the memory stores a plurality of the original check data in the memory during the blank period, and the data input part repeats an operation of setting the clock of the optimal margin with respect to the plurality of the original check data stored in the memory and finally sets a clock having a highest setting frequency as the clock of the optimal margin.

16. The data input apparatus as claimed in claim 14, wherein the memory stores valid data, the data latch latches the valid data from the memory according to the plurality of clocks, and the optimal data selector selectively generates valid data latched according to the clock of the optimal margin among the plurality of valid data input from the data latch.

17. A liquid crystal display device, comprising:
- a liquid crystal display panel displaying an image through a pixel matrix using liquid crystals;
- a gate driver driving a gate line of the pixel matrix;
- a data driver driving a data line of the pixel matrix; and
- a timing controller processing data input through a data input part, supplying processed data to the data driver, and controlling the gate driver and the data driver, wherein the data input part comprises:
- a memory storing data;
- a clock converter inputting a transmission clock transmitted together with the data from the memory and converting the transmission clock into a plurality of clocks having different phases from each other and a same frequency as the transmission clock;
- a data latch latching the data from the memory according to the plurality of clocks from the clock converter; and
- an optimal data selector setting a clock of an optimal margin by comparing the plurality of the latched data generated from the data latch with original data from the memory.

* * * * *